United States Patent [19]
Ade et al.

[11] Patent Number: 5,391,869
[45] Date of Patent: Feb. 21, 1995

[54] SINGLE-SIDE GROWTH REFLECTION-BASED WAVEGUIDE-INTEGRATED PHOTODETECTOR

[75] Inventors: Robert W. Ade, Bolton; Donald E. Bossi, South Windsor; James M. Berak, Sr., East Hartford; Rocco P. Basilica, Colchester, all of Conn.

[73] Assignee: United Technologies Corporation, Hartford, Conn.

[21] Appl. No.: 39,807

[22] Filed: Mar. 29, 1993

[51] Int. Cl.⁶ .............................................. H01J 5/16
[52] U.S. Cl. ................................ 250/227.24; 385/130
[58] Field of Search ...................... 250/227.11, 227.24, 250/214.1, 216; 385/12, 130, 131, 132

[56] References Cited

U.S. PATENT DOCUMENTS

| | | | |
|---|---|---|---|
| 4,381,882 | 5/1983 | Sabine | 250/227.24 |
| 4,549,782 | 10/1985 | Miller | 250/227.24 |
| 5,107,310 | 4/1992 | Grudkowski et al. | 357/16 |
| 5,233,187 | 8/1993 | Sakata et al. | 250/227.24 |

OTHER PUBLICATIONS

Monolithic Integration of a 3-GHz Detector/Preamplifier Using a Refractory-Gate, Ion-Implanted Mesfet Process ( Dennis L. Rogers; IEEE Electron Device Letters, vol. Ed1-7, Nod. 11, Nov. 1986).
Integration of GaAs MESFET Drivers with GaAs Directional Coupler Electro-Optic Modulators (J. H. Abeles et al; Electronics Letters, vol. 23, No. 20; Sep. 1987).
Monlithic Integration of Singlemode AlGaAs Optical Waveguides at 830nm with GaAs E/D-MESFETs Using Planar Multifunctinoal Epistructure (PME) Approach (S. D. Mukherjee et al; Electronics Letters; vol. 27, No. 24; Nov. 1991).
Monolithic Integration of GaAs-Waveguide Optical Intensity Modulator with MESFET Drive Electronics (R. W. Ade et al; Electronics Letters, vol. 28, No. 8 pp. 702–703; Apr. 1992).
Low-Loss Monolithic Integration of Balanced Twin-Photodetectors with a 3 db Waveguide Coupler for Coherent Lightwave Receivers (R. J. Deri et al; IEEE Photonics Technology Letters, vol. 2, No. 8, Aug. 1990).
Monolithic InGaAs Photodiode Array Illuminated Through an Integrated Waveguide (R. Trommer; Electronics Letters, vol. 21, No. 9; Apr. 1985).
High-Speed 1.3 m GaInAs Detectors Fabricated on GaAs Substrates (Dennis L. Rogers et al; Electron Device Letters, vol. 9, No. 10; Oct. 1988).
High-Speed Photodetectors on InGaAs/GaAs-on-GaAs Superlattices (M. Zirngibl et al; J. Appl. Phys. 69 (12), Jun. 1991).
High Efficiency Waveguide-Integrated 1.3 m InGaAs/GaAs MSM Detector as an Optical Delay Line Switch for Microwave Phased Arrays (W. Ng et al; Integrated Photonics Research, vol. 10, USA Tech. Digest Serv., Optical Society of America, Wash., D.C. 1992; pp. 118–119).

*Primary Examiner*—David C. Nelms
*Attorney, Agent, or Firm*—Gerald L. DePardo

[57] ABSTRACT

A single-side growth reflection-based photodetector includes a waveguide structure 8 comprising a "strip-loaded rib" waveguide 10 which accepts light 11 from an input end-face 7 and confines the light to a predetermined spatial optical mode 12. The light 11 propagates along the waveguide 10 and is internally reflected off an edge 18 of a retrograde angled region 20, at one end of the waveguide, to a detector layer 16 where the light 11 is absorbed, thereby creating electron-hole pairs in the detector layer 16. The absorbed light is detected by a metal-semiconductor-metal (MSM) detector comprising an interdigital electrode structure 14 disposed on the outer surface of the detector layer 16 which is disposed above a wide non-waveguide mesa layer 9. For 0.84 micron wavelength light, the detector layer 16 is made of GaAs. Alternatively, for 1.3–1.55 micron light, the detector layer 16 is made of InGaAs.

16 Claims, 7 Drawing Sheets

SINGLE-SIDE GROWTH REFLECTION-BASED WAVEGUIDE-INTEGRATED PHOTODETECTOR

CROSS-REFERENCES TO RELATED APPLICATIONS

Co-pending U.S. patent application, Ser. No. (UTC Docket No. R-3696), entitled "Integrated Optical Receiver/Transmitter", filed contemporaneously herewith, contains subject matter related to that disclosed herein.

TECHNICAL FIELD

This invention relates to waveguide-integrated optical detectors (photodetectors), and more particularly to an optical detector grown all on one side of a substrate having a totally reflective side edge.

BACKGROUND ART

A waveguide-integrated optical detector (photodetector), as is known, is a photodetector which detects the intensity of light propagating along a waveguide integrated therewith, and provides an electrical signal indicative thereof. There are numerous techniques known in the art for making such photodetectors.

One technique common in the art of waveguide integrated photodetectors is leakage-based or "evanescent-coupled" detection. In a leakage-based detector, input light is guided along a waveguide located on the device (i.e., waveguide layers, having a lower cladding layer and a core layer) and a detector layer, made of a material having an energy bandgap smaller than that of the energy of the light being detected, is grown adjacent to the core of the waveguide. Light propagating along the waveguide core layer leaks into the detector layer which, because the energy of the light is greater than the bandgap of the detector layer, is absorbed by the detector layer generates electron hole pairs therein which are detected by electrodes disposed on the surface of the detection layer, as is known.

One problem with leakage-based detection is that the detector is not exposed to the peak intensity of the light because the peak intensity only exists in the central portion of the waveguide layers, not in the detection portion. Consequently, less than optimum optical signal detection and slower response time occurs. Also, because detection is based on the amount of light that leaks from the waveguide, this technique is very sensitive to the spatial mode distribution of the light.

Another technique known in the art of waveguide integrated photodetectors is that of "regrown" or "butt-coupled" detection. This technique also provides waveguide layers which propagate light along the device grown above a substrate. At a receiving end of the waveguide, a portion of the waveguide layers is etched away and detector layers are grown, thereby allowing the light to propagate directly (head-on) into the detector layers. This technique avoids the problems of leakage based detection by allowing the peak intensity to be incident directly on the detector layers. The process of growing the detector layers on the same substrate after etching away the waveguide layers is known as "regrowth" upon the original substrate. Regrowth results in a lower quality of growth because it is the second time layers have been grown from the same substrate. Consequently, "regrowth" detection layers provide lower quality optical detection. A similar result occurs if the detection layers are grown first and then part of the detection layers are etched away and the waveguide layers are grown (or regrown) on top of the substrate. In that cased the regrowth of the waveguide layers produces a low quality growth, thereby resulting in a lossy waveguide, less than optimum optical detection, and a longer, more difficult and more expensive fabrication process.

A third known optical detection technique provides optical detector layers grown on one (e.g., top) surface of a substrate and waveguide layers grown on the other (e.g., bottom) surface of the substrate having one end of the substrate (directly opposite the detector) etched away (i.e., an etched mirror) at a predetermined angle, thereby providing a reflective surface, such that the light travelling along the waveguide layers is reflected upwardly through the substrate and into the detector layers where the light is detected. Such a technique is described in the articles: R.J. Deri et al, "Low-Loss Monolithic Integration of Balanced Twin-Photodetectors with a 3dB Waveguide Coupler for Coherent Lightwave Receivers" IEEE Photonics Technology Letters, Vol. 2, No. 8 (August 1990), and R. Trommer, "Monolithic InGaAs Photodiode Array Illuminated through an Integrated Waveguide", Electronics Letters, Vol. 21, No. 9 (April 1985).

This technique requires at least two growth steps because the detector layers and the waveguide layers are grown on opposite sides of the substrate. More specifically, the detector layers are grown on one side of the substrate in a first growth process, and the waveguide layers are grown on the other side of the substrate in a second growth process. Thus, this is a cumbersome, time consuming procedure. Furthermore, because the light must be reflected through a thick, non-absorbing substrate wafers the light reflected from the etched mirror will diverge (due to the large thickness of the substrate) before reaching the detector layers on the opposite surface of the substrate, thereby precluding the use of extremely small detectors.

Thus, it would be desirable to design a waveguide integrated optical detector that does not suffer from high optical loss or beam-spread and that allows for small optical detectors and does not require two-sided substrate growth.

Disclosure of the Invention

Objects of the invention include provision of a waveguide-integrated optical detector (photodetector) which does not require multiple growth or regrowth steps, which does not have large optical loss, which-has minimal beam spread, and which allows for minimal detector size.

According to the present invention, a waveguide-integrated photodetector employs waveguide means which receives input light at a first end and confines the light vertically and laterally along the waveguide; a detector layer is disposed adjacent to the waveguide means; a reflective angled surface is provided at a second end of the waveguide means for reflecting the light onto the detector layer, and has a predetermined angle so as to provide total internal reflection; the detector layer is made of a material having an energy bandgap smaller than the energy of the input light, thereby allowing the reflected light to be absorbed by the detector layer and creating electron-hole pairs therein; detection means are provided to detect (or collect) the electron-hole pairs generated by the reflected light within the detector layer.

According further to the present invention, the detection means is an interdigital electrode structure disposed on the outer surface of the detector layer.

According still further to the present invention the waveguide means has an upper cladding layer, a core layer, and a lower cladding layer.

Still further according to the invention, the thickness of the core layer determines the dimension of the vertical confinement.

In still further accord to the invention, the upper cladding has a mesa region, below which substantially all of the light propagates along the waveguide core layer, having a thickness that defines a first effective index of refraction, and a lower region having a thickness that defines a second effective index of refraction, the first index of refraction being greater than said second index of refraction by an amount which laterally confines the light and which determines a lateral dimension of the lateral confinement.

The invention represents significant improvements over prior optical detectors by providing detection of the peak intensity of the light within the waveguide. Also, the epitaxial layer structure of the invention is produced in a single growth sequence thereby avoiding complicated regrowth or two-sided wafer growth required for other waveguide-integrated photodetector techniques. Furthermore, as long as the angled mirror satisfies the total-internal-reflection (TIR) condition, mirror coupling/reflection is both polarization and wavelength independent, because it does not rely on a particular spatial mode profile of the propagating light. Further, the invention need not operate with a single optical mode but may also support multiple mode (multi-mode) operation. Still further, the TIR mirror approach enables efficient monolithic coupling between the waveguide and an extremely small area photodetector. The dimensions of the photodetector are minimized to about the size of the optical beam in the waveguide because the beam travels only a very short distance of unguided propagation from the TIR mirror to the detectors thus minimizing beam spread. Further, the invention will work with light at wavelengths near 0.8 microns (popular in short distance communications applications) as well as 1.3–1.55 microns (popular in long distance telecommunications applications).

The foregoing and other objects, features and advantages of the present invention will become more apparent in light of the following detailed description of exemplary embodiments thereof as illustrated in the accompanying drawings.

BEST MODE FOR CARRYING OUT THE INVENTION

Figure 1:
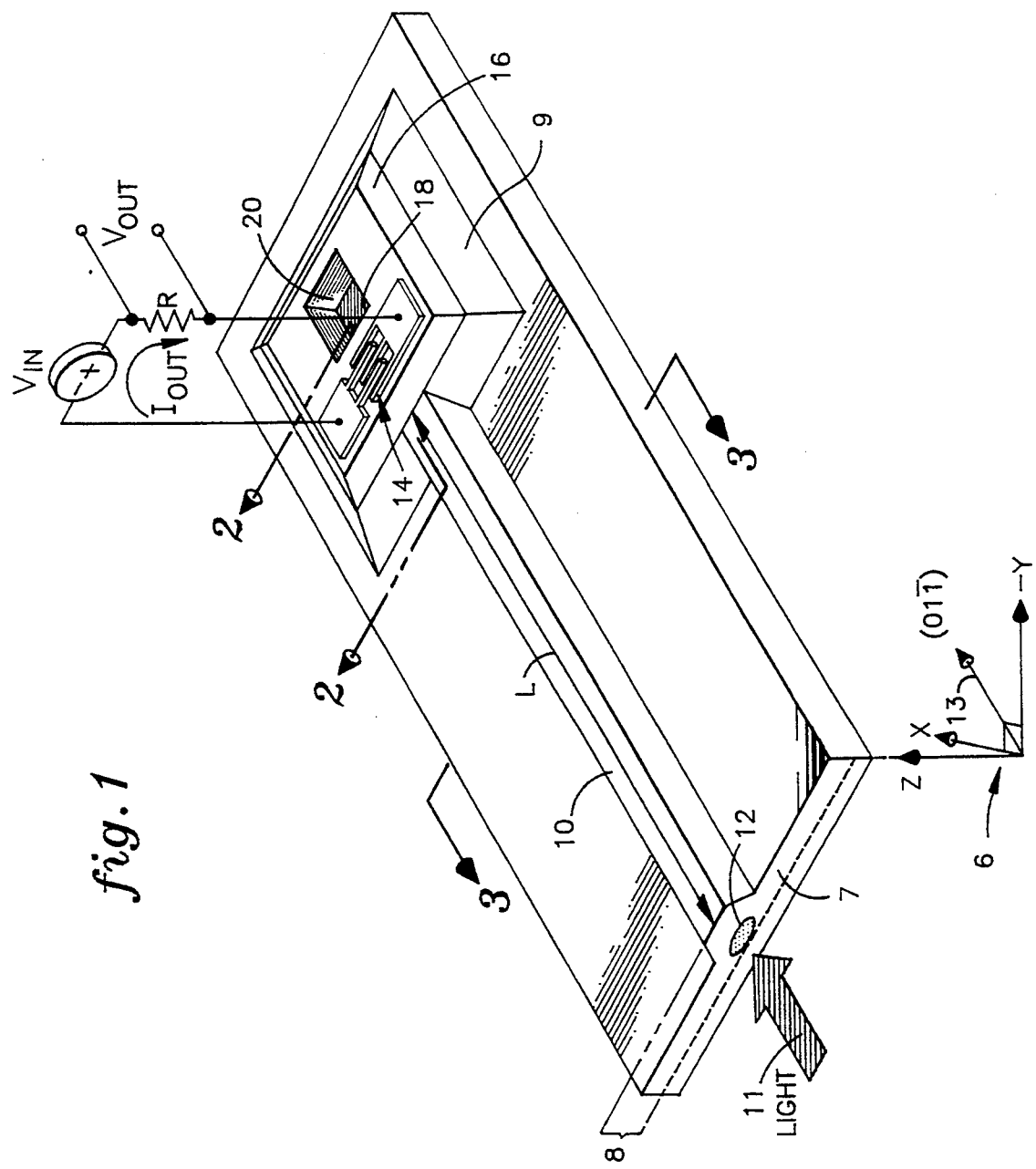
FIG. 1 is a perspective view of a single-side growth reflection-based waveguide-integrated photodetector, in accordance with the present invention.

Referring now to FIG. 1, a waveguide-integrated photodetector comprises a waveguide structure 8 having a "strip-loaded rib" (or channel) mesa waveguide 10 portion which protrudes upwardly and has a wider non-waveguide mesa portion 9. The terms "rib" waveguide and "channel" waveguide are used as equivalent terms herein. The length L of the waveguide rib 10 is about 1 cm long; however other lengths may be used if desired. Light 11 is launched into a front surface 7 (or input end-face) of the waveguide integrated photodetector along the length of the waveguide structure 8. The front surface 7 may be coated with an anti-reflective coating to maximize the coupling of the light 11 into the waveguide structure 8, thereby boosting the input coupled power. The waveguide 8 confines the light 11 both vertically and laterally to a predetermined spatial distribution profile 12 (discussed more hereinafter). The light 11 propagates along the waveguide 8 in a direction indicated by a line 13 (zxy;011(bar)) between the x-axis and the negative y-axis of an xyz-coordinate system 6 of the device (due to etching constraints discussed hereinafter); however, the opposite direction of propagation (01(bar) 1) may be used if desired. The light 11 is internally reflected off an edge 18 of an etched region 20, to a detector layer 16 where the light is absorbed. The absorbed light is detected by a metal semiconductor metal (MSM) detector comprising an interdigital metal electrode structure 14 disposed as well as the semiconductor detector layer 16. Instead of an interdigital electrode structure/layout, other metal electrode layouts may be used if desired.

More specifically, when the light is absorbed by the detector layer 16, electron-hole pairs are generated therein which cause a current to flow between electrodes (or fingers) of the interdigital electrode structure 14 and through a voltage source $V_{in}$ and a series resistor R, both connected across the interdigital electrode structure 14. An output voltage $V_{out}$ is monitored across the resistor R. The voltage $V_{out}$ is indicative of the current $I_{out}$ which is related to the electron-hole pairs generated by the incident light. Thus, the output voltage $V_{out}$ is indicative of the intensity of the light 11.

Figure 2:
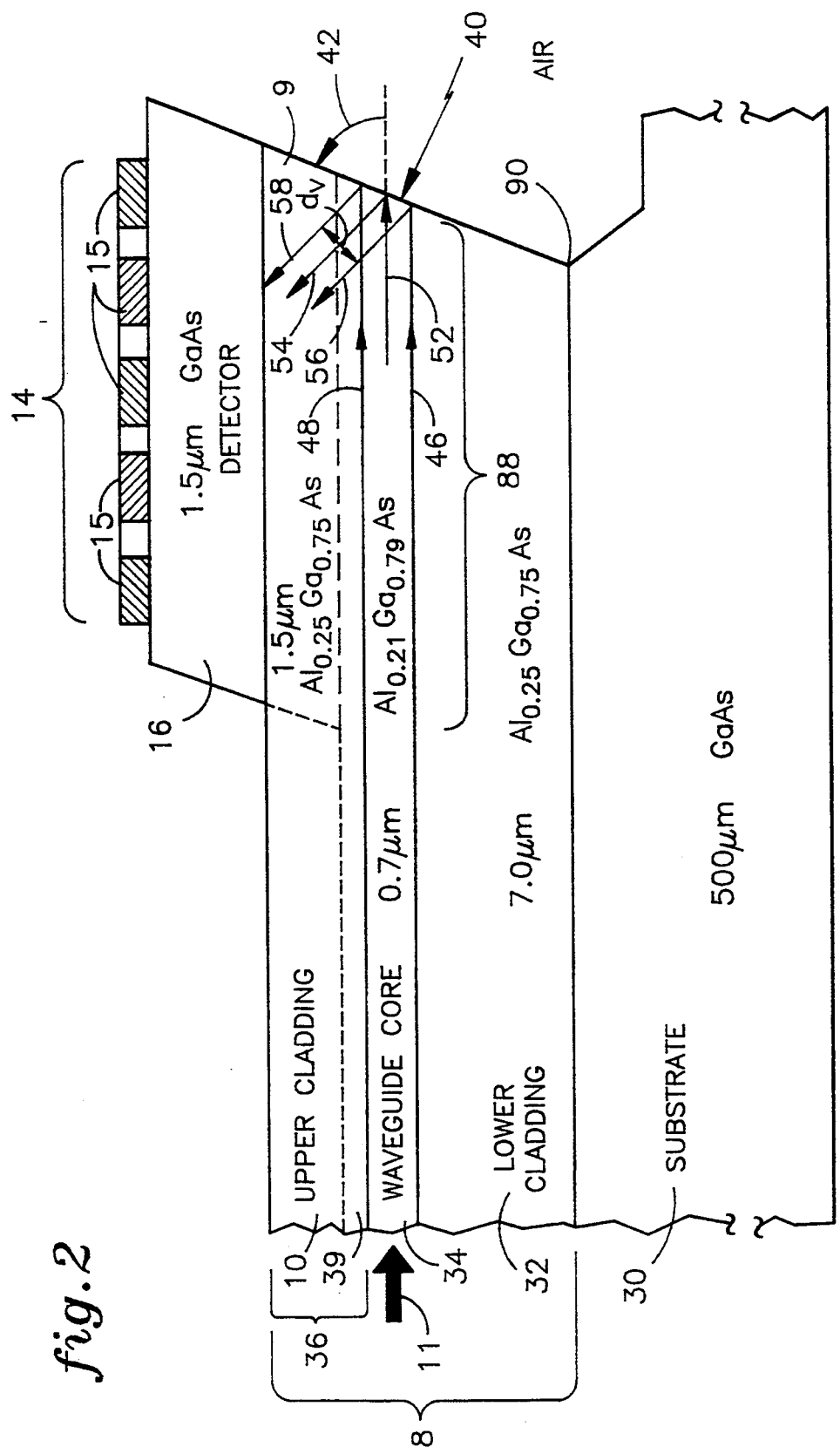
FIG. 2 is a longitudinal cut-away view of the photodetector of FIG. 1 along lines 2—2, showing waveguide layers, a detector layer, and an etched mirror surface, in accordance with the present invention.

Referring now to FIG. 2, the detector includes a substrate 30 made of semi-insulating GaAs having a thickness of about 500 microns; however, other thicknesses may be used if desired. The cut of the substrate is zxy=100, i.e., the z-axis points perpendicular to the wafer surface and the x and y axes lie in the plane of the wafer, as shown by the xyz-coordinate system 6 (FIG. 1). The substrate 30 may instead be made of heavily n-doped gallium arsenide (n+-GaAs), if desired; however this may produce excess undesired charge carriers. Alternatively, the substrate may be made of any III-V semiconductor, if desired. Above the substrate 30 is a lower cladding layer 32 made of intrinsic (i), or not intentionally doped (NID), aluminum gallium arsenide having a twenty-five percent concentration of aluminum ($Al_{0.25}Ga_{0.75}As$) and a thickness of about 7 microns.

Above the lower cladding layer 32 is a waveguide core layer 34 made of NID $Al_{0.21}Ga_{0.79}As$ having a thickness of about 0.7 microns. Above the waveguide core layer 34 is an upper cladding layer 36 made of NID-$Al_{0.25}Ga_{0.75}As$ having a thickness of about 1.5 microns directly over the propagating optical mode 12 (FIG. 1) of the light 11. The lower cladding layer 32, the waveguide core layer 34, and the upper cladding layer 36, make up the waveguide structure 8 discussed hereinbefore with FIG. 1.

Above a portion of the upper cladding layer 36 is the detector layer 16 made of NID GaAs having a thickness of about 1.5 microns. Other thicknesses may be used if desired. The thicker the detector layer 16 is, the more light is absorbed thereby. However, if the detector layer 16 is too thick, the response (or transit) time may be too long, i.e., the time from when the electron-hole pairs are generated at the bottom of the layer 16 to when they are detected at the electrode structure 14 (FIGS. 1,2). Also, the upper surface electrode structure 14 provides some internal reflection of unabsorbed light, allowing further absorption of the light to occur by keeping some light within the detector layer for a longer period of time. For a thickness of 1.5 microns and upper surface electrodes, 83% of the light at 0.84 microns is absorbed in the detector layer 16.

There may be other material layers or air between the upper surface of the upper cladding and the detector layer; however the distance from the upper cladding layer to the detector layer should be minimized to minimize the spread of the reflected beam (discussed hereinafter), Disposed on the surface of the detector layer 16 is the interdigital electrode structure 14 (FIG. 1) having a plurality of electrodes (or fingers) 15 half connected to a bond pad on one side the other half connected to another bond pad on the other side (FIG. 1). The fingers 15 are about 2 microns wide, 0.3 microns high, and have about a 2 micron spacing between the fingers 15. Other dimensions and spacing may be used if desired, e.g., 1 micron width fingers and 1 micron spacing. The electrodes 15 are made of multilayered Titanium/-Platinum/Gold (Ti/Pt/Au); however, other electrode material may be used if desired.

A portion of the upper cladding layer 36, is etched away to form the mesa 10 (FIG. 1, FIG. 2) having a height of about 1 micron. A remaining portion 39 of the layer 36, having a thickness of about 0.5 microns, remains unetched above the waveguide core layer 34. The non-waveguide mesa portion 9 of the waveguide structure 8 (FIGS. 1,2) remains at the thickness of 1.5 microns.

Other thicknesses of the lower cladding layer 32 may be used if desired, provided it is thick enough to prevent the light 11 travelling along the waveguide core layer 34 from leaking into the substrate 30. The thicker the lower cladding layer 32, the less light is lost from the waveguide core into the substrate 30; however, other losses still exist, such as free carrier absorption by the core 34 and the cladding layers 32,36. For a cladding thickness of 7 microns, the total light lost from the waveguide for a given length of the waveguide is about 0.5 dB/cm, only a small portion of this loss is into the substrate 30. Also, other thicknesses of the upper cladding layer 36 may be used if desired, provided it is thick enough to prevent light traveling along the waveguide core layer 34 directly below the mesa 10 from radiating out of the upper cladding 36, or, to prevent absorption of light traveling along the waveguide 34 by any material (such as metal electrodes) which may be disposed on the outer surface of the upper cladding 36.

The percent concentration of Al in the core layer 34 and the upper and lower cladding layers 32,36 is chosen based on a predetermined thickness and a predetermined % Al of the core layer 34 as follows. The thickness of the core layer 34 is chosen based on the desired vertical dimension $d_v$ (FIG. 3; discussed hereinafter) of the spatial mode profile 12 (FIG. 1). The % Al of the core layer 34 is chosen to be within the concentration range where the light is transparent, e.g., 21%. Other % Al cores may be used if desired; however, below a known threshold of Al concentration, the AlGaAs core begins to absorb 0.84 micron light.

As is known, for a waveguide to operate properly, the core layer 34 composition must have an index of refraction greater than that of the composition of the cladding layers 32,36. Thus, there must be a $\Delta n$ between the core layer 34 and the lower cladding layer 32 and a $\Delta n$ between the core layer 34 and the upper cladding layer 36. If the same composition is used for the upper and lower cladding layers, the $\Delta n$ value is the same between the core and the upper or lower claddings.

A given thickness and a given % Al of a rectangular waveguide core 34, gives a known range of $\Delta n$'s between the core and cladding layers to provide a desired number of vertical modes in the waveguide, e.g., single mode for the composition described hereinbefore. To provide a desired $\Delta n$, the value of $\Delta n$ (i.e., the difference in % Al between the core and cladding layers) is selected by a known relationship between $\Delta x$ and $\Delta n$ for a given material composition, e.g., AlGaAs. In general, the higher the concentration of Al, the lower the n value.

Thus, other percent concentrations of Al may be used if desired, provided the $\Delta n$ value between the core layer 34 and the cladding layers 32,36 remains unchanged. For example, instead of a 21% Al core layer 34 and 25% Al upper and lower cladding layers 36,32, a 31% Al core and 35% Al claddings may be used. In that case, the corresponding Ga concentrations will change accordingly, i.e., 69% core and 65% claddings.

The layers 32,34,36,16 are grown above the substrate 30 using a known growth technique, such as Metal Organic Chemical Vapor Deposition (MOCVD). However, any other epitaxial growth technique may be used if desired, such as molecular beam epitaxy (MBE).

At the right end of the device, the detector layer 16, the upper cladding layer 36, the waveguide layer 34, and the lower cladding layer 32, are etched to provide a surface 40 (representing the edge 18 of the etched region 20 shown in FIG. 1) having a predetermined angle 42 relative to the horizontal such that light propagating along the waveguide 34 experiences total internal reflection (TIR) such that no light passes through the surface 40 to the right thereof. It should be understood that it is required for the invention only that the waveguide core layer 34 have a properly angled etched mirror 40, the etch angles of the other layers 32,36,16 are not critical to the present invention. However, some minimal power may be lost if the etch angles of the claddings do not meet the TIR requirement.

The minimum allowable critical angle $\theta_c$ needed to provide a TIR surface is determined from the known equation:

$$\theta_c = \sin^{-1}\left(\frac{N_{air}}{N_{2eff}}\right) \quad \text{[Eq. 1]}$$

where $\theta_c$ is the angle measured from a line normal to the incident surface, $N_{air}$ is the refractive index of air and is equal to 1, and $N_{2eff}$ is the effective refractive index seen by the optical mode 12 (FIG. 1) which is related to the refractive index of the core 34 and the cladding layers 32,36 and is equal to about 3.45 (discussed more hereinafter). Thus, $\theta_c$ equals about 17° and the corresponding critical value for the angle 42 must be less than or equal to 90° minus 17°, or 73°.

The light beam 11 enters the waveguide 34 from the left of the device and propagates along the waveguide until hitting the etched mirror 40. A central ray 52 of the beam 11 reflects off the etched mirror 40 and is reflected upwardly and to the left as a ray 54. Similarly, rays 46,48 bordering the upper and lower walls of the waveguide 34 are reflected upwardly and to the left off the mirror 40 as rays 56,58, respectively. All the rays in the beam 11 propagating within the waveguide core 34 have a reflected angle relative to the surface 40 equal to their angle of incidence onto the surface 40. The central ray 52 of the beam 11 has an intensity indicative of the maximum intensity of the beam 11 and the intensity drops off in a predictable way at points away from the center toward the walls of the waveguide 34 (discussed hereinafter).

Accordingly, the light beam 11 reflects off the mirror 40 and travels through the upper cladding layer 36 and into the detector layer 16, where it is absorbed. When the light 11 is travelling along the waveguide 34 it does not enter the upper cladding because of the difference in refractive index between the 21% Al waveguide core layer 34 and the 25% Al upper cladding layer 36, and because the light is propagating parallel to the waveguide/upper cladding and waveguide/lower cladding interfaces. More specifically, the critical angle below which light will pass from the waveguide core layer 34 into the upper cladding layer 36 or the lower cladding layer 32, is about 84°. But, the angle of the propagating light is about 90°, so no penetration occurs. However, when the light is reflected off the mirror 40, the light passes easily through the upper cladding layer 36 because the angle of incidence is less than the critical angle of about 84°.

The first step in fabricating the device, after epitaxially growing the layers 32,34,36,16 from the substrate 30, employs a known photolithographic "liftoff" process to pattern the electrode structure (FIGS. 1,2) on the detector layer 16. This defines an active detection region where the electrodes 15 are located, having a total surface area of about 50+50 microns². Other size active detection regions may be used if desired. Then, a plurality of successive wet chemical etches are performed to define the detector mesa layer 16, the supporting mesa layer 9, and the waveguide rib mesa 10 (also see FIG. 1). The final fabrication step involves providing a "retrograde" or "dovetail" etch (i.e., an etch that angles under the etch mask) to form the TIR mirror 40, by etching a region 20 (FIG. 1) about 11 microns into the top surface. The electrode structure 14 is deposited before the etching is performed to provide a highly planar surface to ensure good photolithographic definition of the electrode structure 14.

The most common techniques used in the art to produce integrated reflective etches include ion-beam-assisted etching (IBAE) in $Cl_2$ and wet chemical etching in an acid bath of: 1 part $H_2SO_4$, 8 parts $H_2O_2$, 1 part $H_2O$; however, other etching techniques and masks may be used if desired. The IBAE technique requires orientating the axis of the wafer with respect to an incident ion beam to achieve the mirror angle 42. Both etching techniques require disposing a photoresist (or resist) etch mask layer over the areas not to be etched. For the wet chemical etching technique, the surface is then dipped in the aforementioned acid bath. While the wet etch technique relies on crystallographic etch-rate dependencies and thus requires proper selection of etch chemicals to achieve the desired etch, it is less expensive than the IBAE technique. To provide a retrograde wet chemical etch, the etch must be done along a line (defined by an edge of the mask) perpendicular to the 011(bar) line 13 (FIG. 1; also indicative of the propagation of the light 11) between the x-axis and the negative y-axis of the xyz-coordinate system 6.

Regarding the wet chemical etch, we have found that to achieve an etched angle of less than 73° for the angle 42 (i.e., the required angle to provide TIR) the photoresist mask should be well adhered, e.g., baked on, to the top surface; otherwise significant etching will occur immediately horizontally under the photoresist layer (i.e, photoresist mask under-cutting), thereby making the angle 42 greater than 73° and allowing light to pass through the mirror 40. Another consequence of excessive photoresist under-cutting is that the etching may reach the electrodes 15 and destroy the structural support therefor. One way to envision this effect is to imagine a pivot point 90 (FIG. 2) located a fixed distance of 8.3 microns below the surface of the photoresist layer and a fixed distance of 7.5 microns from the right end of the photoresist (which is disposed on the top surface of the detector layer 16). The more photoresist undercutting that occurs, the further to the left the downward etch begins, and thus, the more vertical the angle 42 becomes.

More specifically, we have found that if the photoresist mask is baked onto the upper surface of the detector layer 16 at a temperature of about 150° C., for a time of approximately 16 hours, and then etched, the resulting etch angle 42 is about 70°. More or less bake time may be used if desired; however, it should be greater than about 4 hours. Other temperatures may be used if desired; however, a temperature much higher than 150° C. may hinder the removal of the photoresist layer, and a temperature too far below 150° C. may cause substantial photoresist mask under-cutting to occur. Some etching under the photoresist layer will occur with this technique, e.g., 5 microns, but not enough to make the angle 42 greater than 73°. If the above procedure is followed, we have found that the value of the angle 42 is a repeatable etching characteristic of both AlGaAs and GaAs and the percent composition of Al has no effect on the etch angle 42.

Because the detector uses a mirror 40 and provides direct detection of the peak intensity (central ray 54) of the light 11 propagating in the waveguide 34 (i.e., it is not leakage-based), detection not dependent upon the polarization and wavelength of the light 11.

Figure 3:
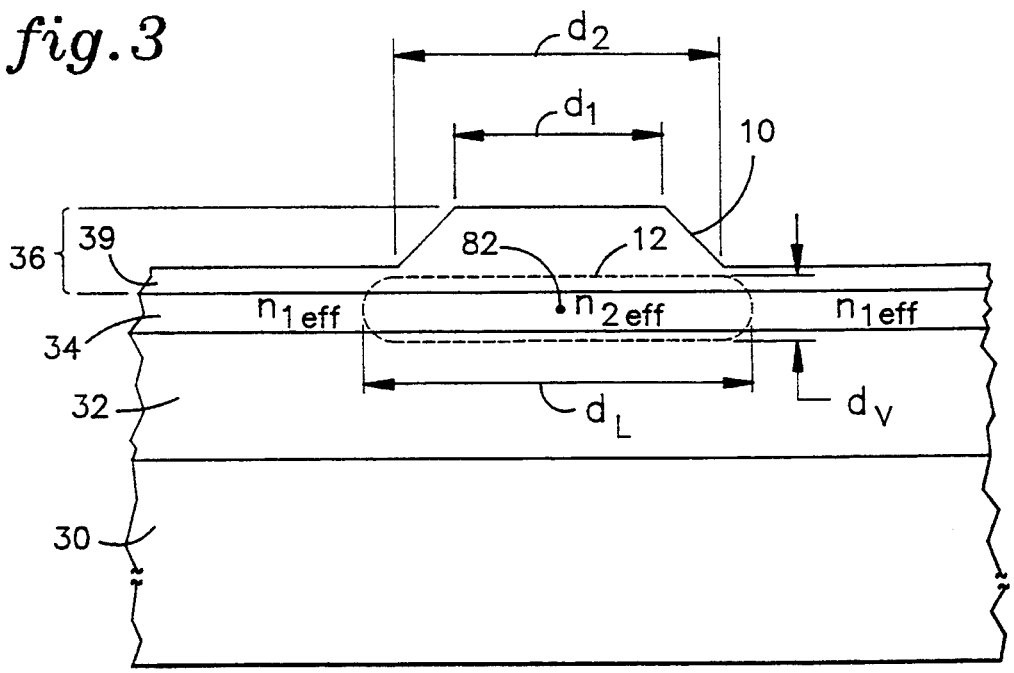
FIG. 3 is a lateral cut-away view of a waveguide portion of the photodetector of FIG. 1 along lines 3—3, showing a waveguide mesa and a spatial optical mode of light propagating in the waveguide, in accordance with the present invention.

Referring now to FIG. 3, the mesa 10 portion of the upper cladding layer 36 has an upper surface dimension $d_1$ of about 5.5 microns and a lower surface dimension $d_2$ of about 7 microns. The mesa 10 may be made by placing a 6 micron wide strip of photoresist along the desired mesa 10 rib region. Other mesa dimensions may be used if desired.

The optical mode 12 (or the spatial light intensity distribution profile) is oval in shape and has maximum intensity at a center point 82. Also, the refractive index seen by a given portion of the waveguide layer 34 is, in part, determined by the thickness of the upper cladding layer 36, which affects the intensity of light in the waveguide core layer 34. Consequently, confinement of light along the lateral dimension $d_L$ and the number of lateral modes is provided by selecting the desired difference between an effective index of refraction $n_{2eff}$ (the same $n_{2eff}$ as in Eq. 1) seen by the waveguide layer 34 under the mesa 10 and an effective index of refraction $n_{1eff}$ seen by the waveguide layer 34 not under the mesa 10. As discussed hereinbefore (with the vertical dimension $d_v$ of the optical mode 12), for a waveguide to operate, the value of $n_{2eff}$ (where the optical mode is propagating; equivalent to a lateral core) must be greater than $n_{1eff}$ (where the optical mode is not propagating; equivalent to a pair of lateral claddings). The difference between $n_{1eff}$ and $n_{2eff}$ ($\Delta n_{eff}$) is selected based on the number of lateral modes desired (similar to the vertical dimension and number of vertical modes discussed hereinbefore).

The value of $n_{2eff}$ changes with the thickness of the mesa 10 region of the upper cladding 36 and the value of $n_{1eff}$ changes with the thickness of the portion 39. Thus, the lower surface dimension $d_2$ of the mesa 10 determines the lateral dimension $d_L$ of the optical mode 12. Also, the desired value of $\Delta n_{eff}$ (based on the desired number of lateral modes) determines the thickness of the portion 39 and, thus, the depth of the etch for the mesa 10.

Figure 4:
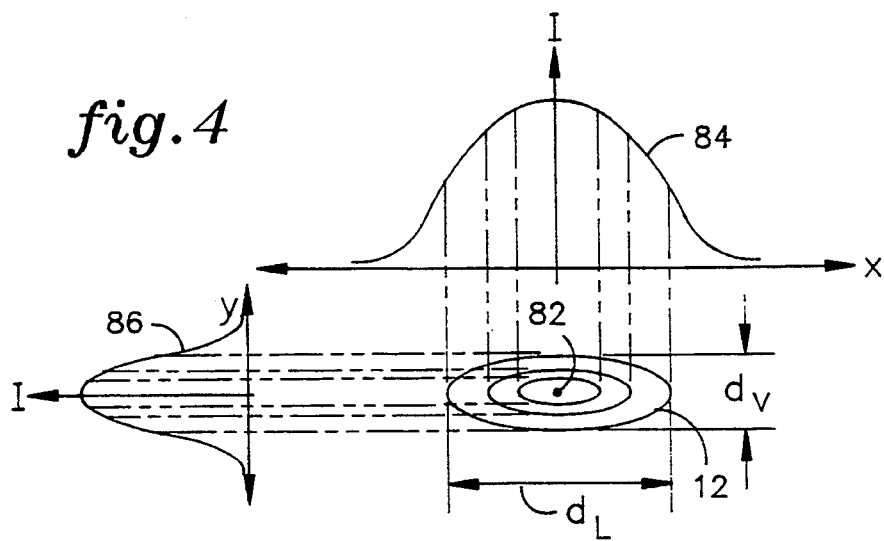
FIG. 4 is a graph showing two dimensions of the spatial mode of light propagating along the waveguide, in accordance with the present invention.

Referring now to FIG. 4, the spatial intensity distribution of the optical mode 12 is actually a series of concentric ovals, the outermost oval being the optical mode 12 as shown in FIGS. 1 and 3, and the central point 82 being the maximum intensity. Each oval represents a region of constant intensity indicative of a given power level as indicated by two intensity plots 84,86, and the optical mode 12 is indicative of half of the peak intensity profile (i.e., full-width-half-max). Other optical mode profiles may be used if desired.

Referring to FIGS. 2, 3, and 4, the dimensions $d_v$, $d_L$ of the optical mode 12 are about 0.7 microns in the vertical dimension $d_v$ and about 7.6 microns in the lateral (or horizontal) dimension $d_L$ (both dimensions being full-width-half-max values). Along the vertical dimension $d_v$, the optical mode 12 remains confined until it is deflected by the TIR mirror 40 (FIG. 2). Along the lateral dimension $d_L$, when the light reaches the region 9 (FIGS. 1, 2), it travels a longitudinal distance 88 (FIG. 2) of unguided propagation from the end of the waveguide rib 10 to the TIR mirror 40, e.g., about 75 microns, and experiences some spreading. When the beam 11 propagates upwardly and to the left through the angular distance across the upper cladding layer 36, both the vertical and lateral dimensions increase. The total increase in the lateral dimension $d_L$ of the mode 12 along the region 88 of waveguide core layer 34 and diagonally across the upper cladding layer 36, is <1 micron. The increase in the vertical dimension $d_v$ (FIG. 2) diagonally across the upper cladding is <1 micron.

The beam 11 experiences minimal spread after being reflected because the angular distance travelled from the mirror 40 to the detector layer 16, is quite small, e.g., <2 microns. Also, because the vertical dimension $d_v$ is smaller than the lateral dimension $d_L$, $d_v$ has a smaller aperture diameter and thus has a larger diffraction angle. Consequently, the vertical dimension $d_v$ of the light spreads at a faster rate than the lateral dimension $d_L$; however, because the vertical dimension is confined until it is reflected and because the distance from the mirror to the detector layer is smalls the resultant spread in the vertical dimension is minimal.

Also, the change in index of refraction between the core layer 34 and the upper cladding layer 36 is small, thereby minimizing the change in the direction of the path of the beam through the upper cladding layer 36.

It should be understood that in order for the light to be absorbed by (and thereby create electron-hole pairs in) the detector layer 16, the energy of the light 11 must be greater than the bandgap energy of the material used for the detector layer 16. For a GaAs detector layer a wavelength of 0.84 microns for the light 11 has sufficient energy to be absorbed by the detector layer 16. Also, the waveguide core 34 and cladding layers 32,36 must be transparent to the wavelength of the light 11, i.e., the energy bandgap is greater than the photon energy of the light injected, so no absorption occurs.

The electrodes 15 on the surface of the detector layer act similar to two back-to-back diodes, i.e., always operating in the reverse-bias region of a metal-semiconductor junction. The combination of the metal electrodes 15 and the semiconductor material of the detector layer 16 therebetween is called a metal semiconductor metal (MSM) device. For an MSM optical detector, when there is no light present, only few mobile charge carriers exist in the detector layer 16, therefore the leakage current (or "dark" current) is quite small, and the corresponding output current $I_{out}$ (FIG. 1) is very small. The configuration described herein provides a dark current of less than 10 nA with a 10 volt bias (Vin) and a breakdown voltage (i.e., maximum allowable Vin that can be applied before high currents are drawn) of 25 volts. However, other bias voltages may be used if desired, resulting in different dark current values.

As discussed hereinbefore, when light is incident upon the GaAs detector layer 16, electron-hole pairs are created and current flows between the electrodes 15. The creation of electron-hole pairs together with an applied voltage (Vin) causes an "ON" reverse-biased diode current to flow that is larger than that of the dark current, e.g., 20.4 μAmps with an input optical waveguide power of 36.5 μWatts.

Figure 5:
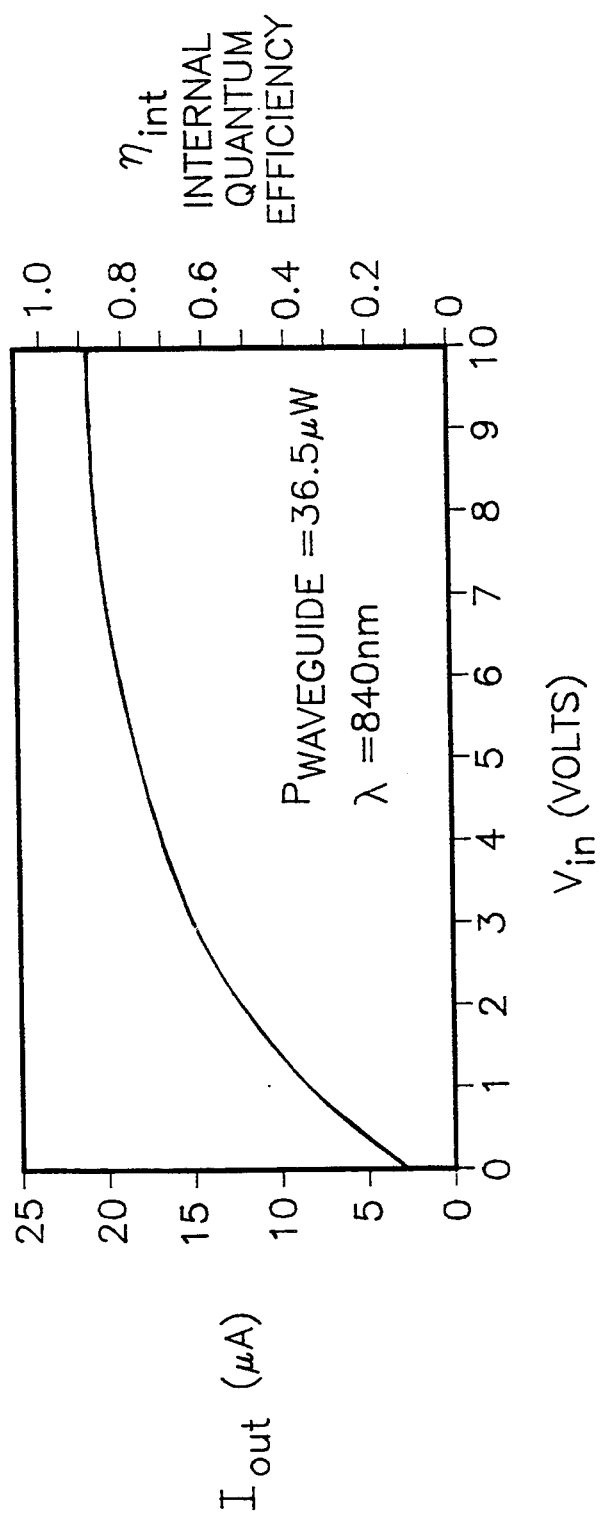
FIG. 5 is a graph showing a plot of output current and internal quantum efficiency against input voltage applied to the detector layer, in accordance with the present invention.

Referring now to FIG. 5, the photoresponse ($I_{out}$ vs $V_{in}$ and $\eta_{int}$ vs $V_{in}$) of a TIR-coupled waveguide photodetector of the present invention shows how the current $I_{out}$ and the internal quantum efficiency $\eta_{int}$ change as the bias voltage $V_{in}$ changes for a given input optical mode power of 36.5 μWatts and an input light wavelength of 0.84 microns. The internal quantum efficiency $\eta_{int}$, as is known, is an indication of how efficiently the photons in the waveguide are converted into electron-hole pairs detected in the detector layer 16 (i.e., the number of electron-hole pairs collected per photon in the waveguide). As indicated by the graph in FIG. 5, quantum efficiencies near 0.83 are achievable with a $V_{in}$ of 8 volts.

Also, the frequency response of the magnitude of the measured output power ($I_{out}^2 R$) versus modulation frequency of the input light about a steady state power in the waveguide of 36.5 Watts, at 0.84 micron wavelength, exhibits a 3-dB bandwidth of 8 GHz (with a semi-insulating substrate). The bandwidth is limited by the aforementioned carrier transit time and may be expanded by reducing the thickness of the detector layer and/or the finger spacing, as discussed hereinbefore. If an n+-substrate is used, the bandwidth is lower and is limited by capacitance between the electrode bond pads and the n+substrate.

One way to couple light into the waveguide of the present invention is to "butt-couple" a cleaved single mode fiber (not shown) to the front end-face 7 (FIG. 1). A typical single spatial mode fiber core diameter for propagating 0.84 micron wavelength light is 6–8 microns, and for 1.3 micron light the core diameter is 7–10 microns. To provide maximum coupling of light into the waveguide 8 (i.e., to maximize external quantum efficiency $\eta_{ext}$), the optical mode 12 (FIGS. 1,3) in the waveguide 8 should match the size and shape of the optical mode in the fiber as close as is realistically possible. For example, if the vertical dimension $d_v$ of the optical mode is too small, it may be increased by using a thicker core layer 34. In that case, the percent Al of the core layer 34 should increase to decrease the $\Delta n$ between the core and the claddings to maintain single mode operation. More specifically, if thickness of the waveguide core layer 34 is increased to 1.1 microns, and the concentration of Al in the core layer 34 is increased to 22%, such that the waveguide structure 8 comprises $Al_{0.22}Ga_{0.78}As$ surrounded by $Al_{0.25}Ga_{0.75}As$ cladding layers 32, 36 the vertical dimension $d_v$ optical mode 12 would be increased to about 1.0 micron.

It should be understood that any technique for getting light into the waveguide core layer 34 is acceptable for the present invention.

Figure 6:
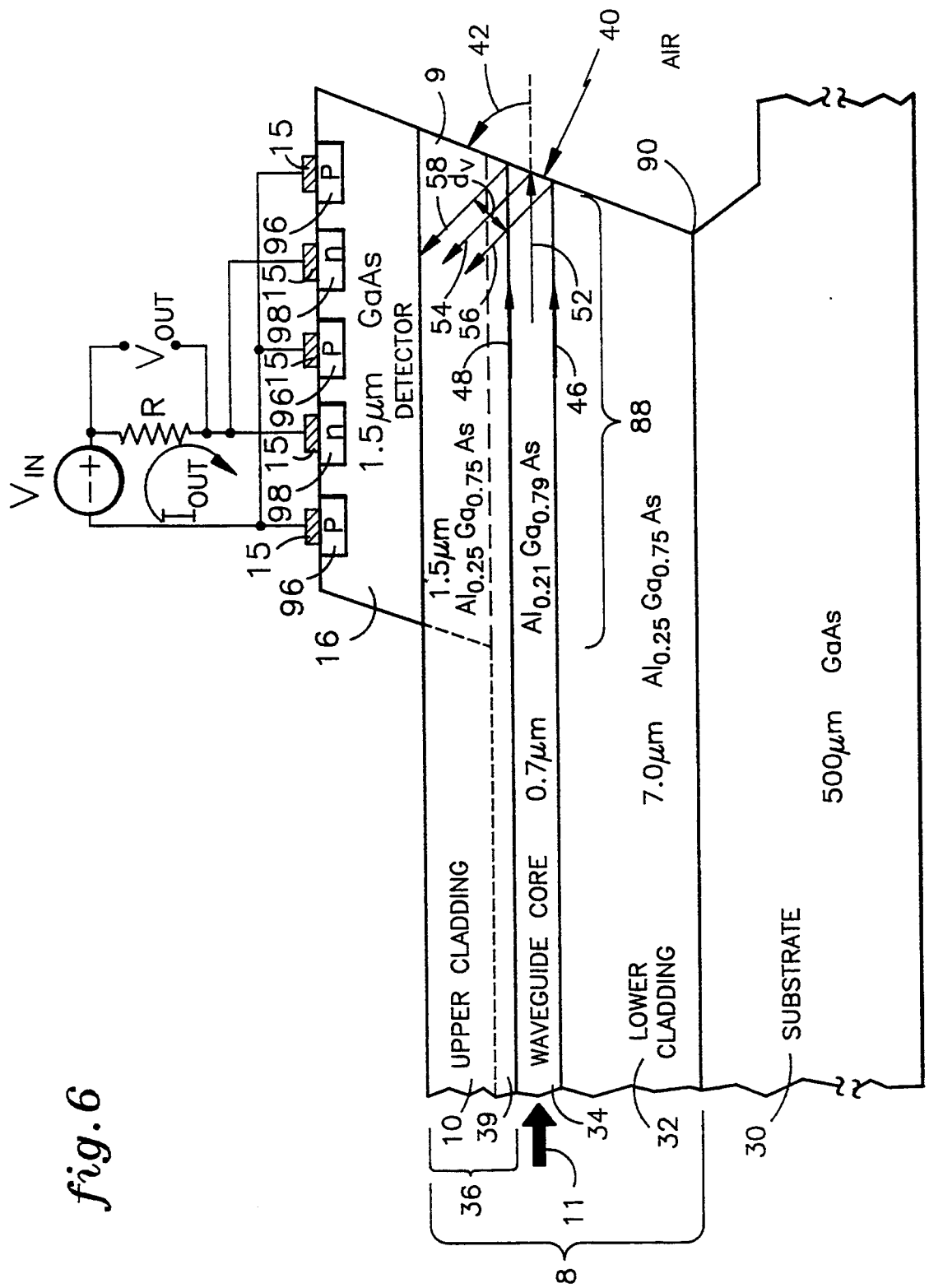
FIG. 6 is a longitudinal cut-away view of the photodetector, showing lateral p-i-n diodes for detecting electron hole pairs in the detector layer, in accordance with the present invention.
Figure 7:
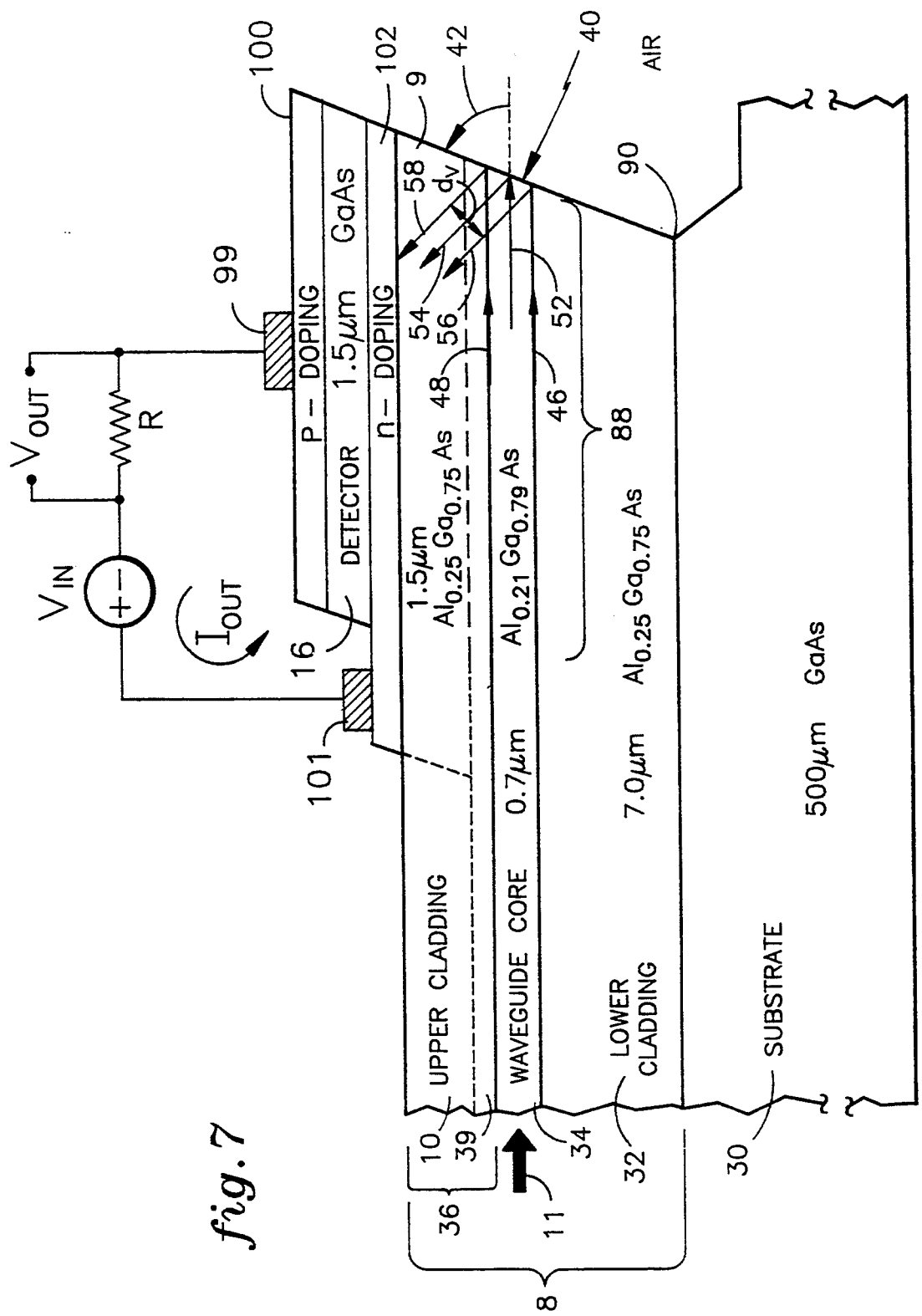
FIG. 7 is a longitudinal cut-away view of a photodetector, showing vertical p-i-n diodes for detecting electron hole pairs in the detector layer, in accordance with the present invention.

Referring now to FIGS. 6 & 7, instead of an MSM detector, lateral (FIG. 6) or vertical (FIG. 7) p-i-n diodes may be used for detection of mobile charge carriers instead of the MSM 14. More specifically, in FIG. 6, laterally displaced p-doped regions 96 and n-doped regions 98 may be implanted in the surface of the detector layer 16 beneath the electrodes 15 to form lateral p-i-n diodes. The voltage Vin and resistor R would be connected in a similar fashion to that shown in FIG. 1. The voltage polarities may be reversed if desired provided the doping polarities are also reversed. The total thickness of the detector layer 16 including the lateral diodes may remain unchanged.

Referring now to FIG. 7, a vertical p-i-n diode is created by p-doping a region 100 along the surface of the detector layer 16 and n-doping a region 102 of the detector layer 16 immediately above the right portion 9 of the upper cladding layer 36. The total thickness of the detector layer 16 including the vertical diode may remain unchanged. Electrodes 99,101 disposed on the p-doped and n-doped regions 100,102, are connected to the voltage source Vin and the resistor R similar to the other embodiments discussed herein. In that case, the layer 102 extends beyond the original layer 16 to provide a contact surface for the electrode 101.

Figure 8:
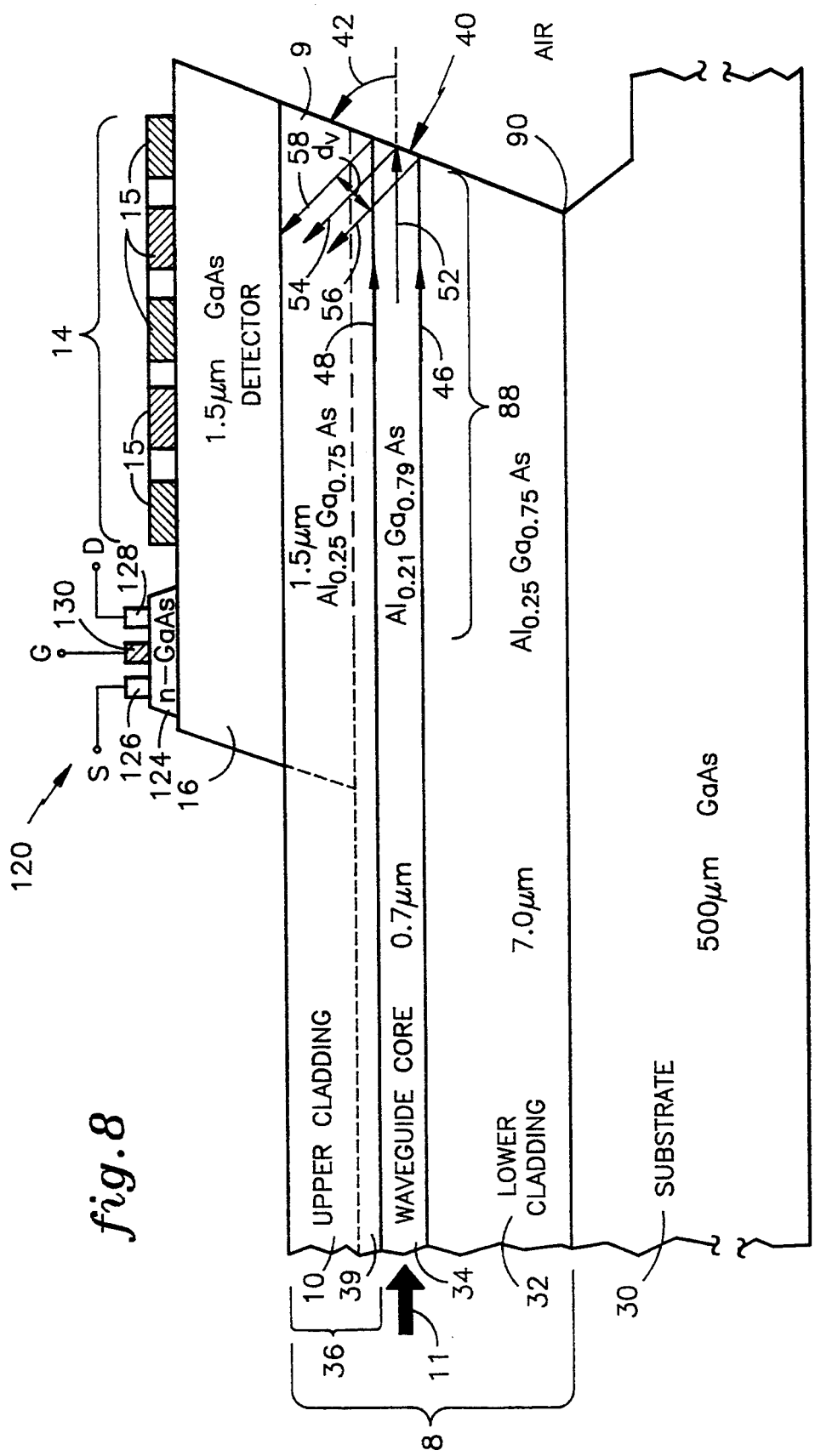
FIG. 8 is a longitudinal cut-away view of a photodetector, showing a field-effect transistor fabricated on the surface of the detector layer, in accordance with the present invention.

Referring now to FIG. 8, because the photodetector is made from a III-V semiconductor substrate, it should be understood by those skilled in the art that field-effect transistors (FETs) such as metal semiconductor field-effect transistors (MESFETs) and modulation doped field-effect transistors (MODFETs) may be fabricated on the surface of the device. When MESFETs are used, the last layer grown is n-doped GaAs for the electronics. The n-GaAs is etched away in all areas except where the electronics are to be placed. Also, patterned metal lines (commonly known in the art of integrated circuit fabrication) may be fabricated on the surface of the device to connect the transistors to the electrode structure 14. Other types of connecting lines may be used if desired.

At least one MESFET 120 is fabricated on the detector layer 16 of GaAs (which has a thickness of 1.5 microns) to support the transistors. Above the GaAs detector layer 16 is an etched mesa 124 of n-GaAs forming an n-channel for the MESFET 120, having a thickness of about 0.2–0.3 microns and a dopant concentration of about $1 \times 10^{17}/cm^3$. Other thicknesses and doping concentrations may be used if desired. Above the n-channel mesa 124 is a pair of ohmic contacts 126,128 made of a layered structure of Gold/Germanium/Nickel (Au/Ge/Ni) representing the drain and source, respectively, of the MESFET 120. Between the ohmic contacts 126,128 is a Schottky contact 130 representing the gate of the MESFET 120, made of a layered structure of Titanium/Platinum/Gold (Ti/Pt/Au), the same composition as the electrode structure 14.

The ability to fabricate FETs on the device allows for the design of a range of electronic circuits from simple switching and/or amplifying circuits to complex networks of logical decision making circuits, Which may be fabricated on the transceiver chip.

Instead of having the electronics that controls and monitors the electrode structure 14 located off the device as shown in FIG. 1, a receiver circuit (not shown) may be fabricated using FETs similar to the MESFET 120. The receiver circuit may perform the function of measuring a current signal generated by the light incident on the photodetector, and converting the current into a voltage, or may be more complicated, such as the receiver circuits described in Co-pending U.S. patent application, Ser. No. (UTC Docket No. R-3696), entitled "Integrated Optical Receiver/Transmitter", filed contemporaneously herewith.

An example of such transistor fabrication on a GaAs substrate is that described in U.S. Pat. No. 5,107,310, to Grudkowski et al, entitled "ACT Device With Buffer Channel" and D. Rogers, "Monolithic Integration of a 3-GHz Detector/Preamplifier Using a Refractory-Gate, Ion-Implanted MESFET Process", IEEE Electron Device Letters, Vol. EDL-7, No. 11 (November 1986).

Examples of fabrication of FETs with waveguide-based devices on GaAs substrates include the articles: R. Ade et al, "Monolithic Integration of GaAs-Waveguide Optical Intensity Modulator with MESFET Drive Electronics", Electronics Letters, Vol. 28, No. 8, pp 702–703 (Apr. 9, 1992), showing integration of FETs with optical modulators; S. Mukherjee et al, "Monolithic Integration of Singlemode AlGaAs Optical Waveguides at 830 nm With GaAs E/D-MESFETs Using Planar Multifunctional Epistructure (PME) Approach" Electronics Letters, Vol 27, No. 24, pp 2281–2283 (Nov. 21, 1991), showing integration of FETs with optical waveguides; J. Abeles et al, "Integration of GaAs MESFET Drivers with GaAs Directional-Coupler Electro-optic Modulators", Electronics Letters, Vol. 23, No. 20, pp 1037–1038 (September 1987), showing integration of FETs with directional couplers.

Although the transistor 120 is shown as being fabricated on the detector layer 16, it should be understood that electronic components may be fabricated over the waveguide 10, or over any other portion of the device, by merely leaving a mesa of n-GaAs and GaAs as discussed in copending US patent application, Serial No. (UTC Docket No. R-3696), entitled "Integrated Optical Receiver/Transmitter".

Although the invention has been described as using an interdigital electrode structure 14 (MSM detector) on the upper surface of the detector layer or using lateral or vertical p-i-n diodes as the means for detecting electron-hole pairs generated in the detector layer 16, it should be understood by those skilled in the art that the invention will work equally well with any form of interface capable of detecting mobile charge carriers generated in the detector layer 16.

Also, even though the invention has been described with a GaAs substrate 30 and detector layer 16, and AlGaAs cladding and core layers 32,34,36, other layer compositions and semiconductor materials may be used if desired. To detect light of a longer wavelength (i.e., >about 0.9 microns), the detector layer 16 must be made of a material having an energy bandgap smaller than that of GaAs, because as the wavelength of light gets longer, the energy of the light (photon energy) decreases.

For example, to detect light in the wavelength range of 1.3 to 1.55 microns the detector layer 16 may be made of NID-Indium Gallium Arsenide (InGaAs) with 53% In. In that case, the waveguide cladding and core layers 32,36,34 would be made of NID Indium Gallium Arsenide Phosphide (InGaAsP), with the core layer 34 having a higher index of refraction and, thus, a lower In concentration, than the cladding layers 32,36, and the substrate layer 30 would be made of InP. Other materials and concentrations may be used if desired, provided the lattice mismatch is properly selected. Alternatively, the upper and lower cladding layers may be made of InP.

In the case of an InGaAs detector layer, the electronics (transistors) would likely be fabricated on the InGaAs layer. For a FET, above the InGaAs layer, the channel of the FET would be n-InGaAs, having a cap layer of Indium Aluminum Arsenide (InAlAs) above which the electrodes are attached. Alternatively, for a Heterojunction Bipolar Transistor (HBT) there would be a layered structure comprising n-InGaAs,InGaAs,p-InGaAs,n-InP, and n-InGaAs.

Also, for an InGaAs detector layer 16 (FIG. 2), because the bandgap for InGaAs is much smaller than that of GaAs, a cap layer (not shown) must be used to provide a needed Schottky barrier between the electrodes 15 and the detector layer 16 to minimize dark leakage currents. As is known, the cap layer must be made from a material having a larger bandgap than the InGaAs detection layer (to reduce leakage currents) and should be latticed-matched to the detector layer (to minimize the creation of dislocations). One such material is Indium Aluminum Arsenide (InAlAs) with 52% In; however, other materials and concentrations may be used if desired.

Alternatively, the InGaAs detector layer may be fabricated above a GaAs substrate, as is described in the articles: D Rogers et al, "High-Speed 1.3-$\mu$m GainAs Detectors Fabricated on GaAs Substrates" Electron Device Letters, Vol 9, No. 10 (October 1988); M. Zirngibl et al, "High-speed Photodetectors on InGaAs/GaAs-on-GaAs Superlattices" Journal of Applied Physics, Vol 69, No 12, (June 1991); and W. Ng et al, "High Efficiency Waveguide-Integrated 1.3 $\mu$m InGaAs/GaAs MSM Detector as an Optical Delay Line Switch for microwave Phased Arrays" in Integrated Photonics Research, Vol. 10, OSA Tech. Digest Series (Optical Society of America, Wash. DC 1992), pp 118–119. More specifically, for 1.3–1.55 micron light, the composition of the upper and lower cladding layers 32,36 would be $Al_{0.1}Ga_{0.9}As$ and the core layer 34 would be GaAs (i.e., 0% Al), having a slightly thicker core layer (e.g., 0.85–1.0 microns) than that described hereinbefore.

Also, it should be understood that the FIGS. 1,2,3,6,7 are not drawn to scale and are merely used for illustrative purposes.

Alternatively, to avoid the need for a cap layer in the case of an InGaAs detector, lateral or vertical p-i-n diodes may be used for detection of mobile charge carriers instead of the MSM 14 similar to the alternative embodiments shown in FIGS. 6,7 discussed hereinbefore.

Furthermore, even though the invention has been described as using a single optical spatial mode it should be understood that the invention may also be designed to propagate a plurality of optical modes (multimode operation). In that case, an appropriate An value (vertically and laterally) should be selected to provide the desired number of modes. Without the constraint of being single mode, the thickness of the core layer 34 may be much wider than that described hereinbefore. Consequently, the size of the optical mode within the waveguide core layer 34 may more closely match the mode size of the optical fiber providing the input light 11, thereby improving the external coupling efficiency.

Also, even though the invention has been described as using an upper cladding and a lower cladding surrounding the waveguide core, it should be understood that no material claddings are required provided the change in refractive index between the waveguide and air is suitably tailored to the waveguide structure to prevent an unacceptable leakage of light out of the waveguide.

Also, the detector layer may be made of a different material (not capable of being grown) from the waveguide structure. For example, the waveguide structure may be made of Lithium Niobate $LiNbO_3$ and the detector made of GaAs, with the detector being bonded (with, e.g., epoxy) onto the waveguide in the path of light reflected from the retrograde etch.

Further, the substrate 30 is not required for the invention to operate; thus, the waveguide structure and detector may be removed (or "floated off") from the substrate and bonded to another device or support structure if desired. Still further, any waveguide material, style, design, or shape may be used.

Moreover, although the invention has been described as using etching techniques to create the retrograde angled surface 40 (FIG. 2), any technique for creating a retrograde angled surface may be used if desired.

Instead of a mesa region 10, the invention will also work with a "slab" waveguide (without the mesa 10), providing vertical confinement by upper and lower claddings, and providing horizontal confinement at the outer side edges of the slab at the air interface. In that case, the number of lateral modes is not likely limited to single lateral mode operation.

It suffices for the present invention that one end of a waveguide have a retrograde angled surface that reflects light onto a nearby detector layer.

Further, although a portion of the rib (or channel) waveguides has been described as having etched mesas, it should be understood that any type of rib (or channel) waveguide may be used provided it laterally and vertically confines the propogating light to the desired number of modes and in the desired region of the device. For example, instead of etching mesas to confine the light, the light may be confined by doping regions around the desired waveguide channel, thereby changing the index of refraction enough to confine the light.

Although the invention has been described and illustrated with respect to the exemplary embodiments thereof, it should be understood by those skilled in the art that the foregoing and various other changes, omissions and additions may be made without departing from the spirit and scope of the invention.

We claim:

1. A reflection-based waveguide integrated photodetector, comprising:
    a substrate;
    waveguide means, disposed adjacent to and contiguous with said substrate, for receiving input light at a first end of said waveguide means, and for providing vertical and lateral confinement of said light along said waveguide means;
    a detector layer, disposed adjacent to, and on the same side of said substrate as, said waveguide means;
    a reflective angled surface, disposed at a second end of said waveguide means, for reflecting said light onto said detector layer, said reflective surface having a predetermined angle so as to provide total internal reflection;
    said detector layer, being made of a material having an energy bandgap smaller than the energy of the input light, thereby allowing said light reflected by said reflective surface to be absorbed by said detector layer and creating electron-hole pairs therein; and
    detection means, for detecting said electron-hole pairs created within said detector layer.

2. The detector of claim 1 wherein said detection means comprises an electrode structure disposed on the outer surface of said detector layer.

3. The detector of claim 1 wherein said detection means comprises a lateral p-i-n diode comprising alternating p-doped and n-doped regions along the outer surface of said detector layer.

4. The detector of claim 1 wherein said detection means comprises a vertical p-i-n diode comprising a region of said detector layer having a first dopant polarity near the outer surface of said detector layer and a region of said detector layer having a second dopant polarity opposite to said first polarity near said waveguide means.

5. The detector of claim 1 wherein said waveguide means comprises a lower cladding layer having a thickness thick enough to minimize the leakage of said light to said substrate.

6. The detector of claim 5 wherein said waveguide means comprises a waveguide core layer having a thickness that determines a number of optical modes and a vertical dimension of said vertical confinement within said waveguide means.

7. The detector of claim 6 wherein said waveguide means comprises an upper cladding layer, comprising:
    a mesa region, below which substantially all of said light propagates along said waveguide core layer, having a thickness that defines a first effective index of refraction seen by said waveguide core;
    a lower region having a thickness that defines a second effective index of refraction seen by said waveguide core; and
    said first index of refraction being greater than said second index of refraction by an amount to provide said lateral confinement of said light and a lateral dimension of said mesa region defining a lateral dimension of said lateral confinement of said light.

8. The detector of claim 7 wherein said predetermined number of modes is a single mode.

9. The detector of claim 7 wherein said waveguide core layer and said upper and lower cladding layers comprise AlGaAs, and said core layer has a lower percentage of Al than said upper and said lower cladding layers.

10. The detector of claim 1 wherein said detector layer comprises GaAs.

11. The detector of claim 1 wherein transistors are fabricated on a layer above said substrate.

12. A reflection-based waveguide integrated photodetector, comprising:
    waveguide means, for receiving input light at a first end of said waveguide means, and for providing vertical and lateral confinement of said light along said waveguide means;
    a detector layer, disposed near, and contiguous with said waveguide means;
    a reflective retrograde angled surface, disposed at a second end of said waveguide means, for reflecting said light onto said detector layer, said reflective surface having a predetermined retrograde etch angle so as to provide total internal reflection;
    said detector layer, being made of a material having an energy bandgap smaller than the energy of the input light, thereby allowing said light reflected by said reflective surface to be absorbed by said detector layer and creating electron-hole pairs therein; and
    detection means, for detecting said electron-hole pairs created within said detector layer.

13. The detector of claim 12 wherein said detection means comprises an interdigital electrode structure disposed on the outer surface of said detector layer.

14. The detector of claim 12 wherein said detection means comprises a lateral p-i-n diode comprising alternating p-doped and n-doped regions along the outer surface of said detector layer.

15. The detector of claim 12 wherein said detection means comprises a vertical p-i-n diode comprising a region of said detector layer having a first dopant polarity near the outer surface of said detector layer and a region of said detector layer having a second dopant polarity opposite to said first polarity near said waveguide means.

16. The detector of claim 12 wherein transistors are fabricated on a GaAs layer above said waveguide means.

* * * * *